United States Patent [19]

Kim

[11] Patent Number: 5,314,298
[45] Date of Patent: May 24, 1994

[54] AUTOMATIC LEAD FRAME FEEDING DEVICE FOR A TO-220 SEMICONDUCTOR MANUFACTURING APPARATUS

[75] Inventor: Youl Kim, Daeku, Rep. of Korea

[73] Assignee: Gold Star Electron Co., Ltd., Chungcheongbuk, Rep. of Korea

[21] Appl. No.: 886,830

[22] Filed: May 22, 1992

[30] Foreign Application Priority Data

May 23, 1991 [KR] Rep. of Korea ............... 8377

[51] Int. Cl.$^5$ ............................................. B65G 59/06
[52] U.S. Cl. ............................... 414/797.9; 414/795.6; 221/271
[58] Field of Search ............ 414/795.6, 796.6, 797.9, 414/798, 798.1; 221/272, 273, 274; 901/47

[56] References Cited

U.S. PATENT DOCUMENTS

| | | | |
|---|---|---|---|
| 629,441 | 7/1899 | Fogg | 221/273 |
| 2,268,873 | 1/1942 | Hopkins et al. | 221/273 |
| 4,457,662 | 7/1984 | Ireland et al. | 414/331 |
| 4,555,876 | 12/1985 | Ohtake | 414/795.3 |
| 4,620,285 | 10/1986 | Perdue | 901/47 |
| 4,674,238 | 6/1987 | Suzuki et al. | 414/796.5 |
| 4,735,713 | 4/1988 | Ball | 414/797.9 |
| 4,776,743 | 10/1988 | Kimura | 221/267 |
| 5,190,185 | 3/1993 | Blechl | 221/176 |

FOREIGN PATENT DOCUMENTS

| | | | |
|---|---|---|---|
| 1522113 | 4/1968 | France | 414/798 |
| 0027834 | 2/1982 | Japan | 414/798 |
| 0207220 | 12/1983 | Japan | 414/798.1 |
| 0203028 | 9/1986 | Japan | 414/797.9 |
| 0221014 | 10/1986 | Japan | 414/797.9 |

Primary Examiner—Michael S. Huppert
Assistant Examiner—Gregory A. Morse
Attorney, Agent, or Firm—Birch, Stewart, Kolasch & Birch

[57] ABSTRACT

This invention relates to an automatic lead frame feeding device for a TO-220 semiconductor manufacturing apparatus, which automatically feeds lead frames to die bonding and wire bonding processes for manufacturing TO-220 semiconductor packages, and has an object to provide an automatic lead frame feeding device which can load large quantities of lead frames at a time without using a separate magazine for loading them, and then feed automatically them accurately one by one. To this end, the feeding device includes a loading section including a pair of guide members disposed in spaced opposite relation to each other to stack up lead frames therebetween, a transferring section disposed at one side of the loading section for transverse movement to drop one by one the stacked lead frames in the loading section in sequence beginning with the lowermost lead frame, and a feeding section positioned to feed the dropped lead frame in the loading section to a subsequent process.

6 Claims, 5 Drawing Sheets

AUTOMATIC LEAD FRAME FEEDING DEVICE FOR A TO-220 SEMICONDUCTOR MANUFACTURING APPARATUS

BACKGROUND OF THE INVENTION

1. Field of the Invention

This invention relates to an automatic lead frame feeding device for a TO-200 semiconductor manufacturing apparatus, which automatically feeds lead frames to die bonding and wire bonding processes for manufacturing TO-220 semiconductor packages.

2. Description of the Prior Art

Generally, a semiconductor package is classified into a hole insertion packaging type and a surface packaging type according to a packaging form, and the hole insertion packaging type is further classified into a lead frame type and a pin type. This invention resides in a device for sequentially feeding lead frames during manufacturing of semiconductors of a single inline package type (will be hereinafter referred to as "TO-220 semiconductors") in the lead frame type.

This TO-220 semiconductor has an adverse effect on the semiconductor element resulting from heat generation during operation of the element. Therefore, a heat sink having a radiating surface of a great area and serving as a radiating path has been necessarily provided to be exposed to a top of a casing of the semiconductor element, thereby preventing breakage of the element due to elevation of an internal temperature thereof.

A lead frame having such a radiating path is of the form as shown in FIG. 1 of the accompanying drawings and comprises the heat sink 1a serving as the radiating path, a paddle 1b formed integrally with the heat sink 1a for attaching thereto a chip, a plurality of outer lead portions 1c connected integrally to the paddle 1b through respective bent portion 1f extending at a given angle from the paddle, and a support portion 1d for reinforcing and supporting the outer lead portions 1c. Further, there are formed index holes 1e in the heat sink 1a and the support portion 1d.

During the manufacture of the TO-220 semiconductor packages by using the thus constructed lead frames, the following principal processes are performed: a die bonding process for bonding the chips obtained in a dicing process to the paddles of the lead frames; a wire bonding process for interconnecting the chips and the lead frames by wires; a molding process for hermetically sealing the chips with resin; and a lead shaping process are performed, thereby producing a plurality of the complete semiconductor packages each being of the form as shown in FIG. 2. At this time, to perform the die bonding and wire bonding operations, the lead frames 1 must be loaded in a loader of the semiconductor manufacturing apparatus.

In the past, since the lead frames 1 were slopingly stacked in the loader of the semiconductor manufacturing apparatus owing to the bent portions 1f between the paddle 1b and the outer lead portions 1c, the lead frames could not be introduced directly into the loader, but instead were manually put into a separate magazine (not shown) at equal distances and in the same direction by an operator, and then introduced into the loader along with the magazine containing them. At this time, one magazine can contain about 20 sheets of the lead frames.

When the magazine containing about 20 sheets of the lead frames has been introduced into the loader, the lead frames are fed one by one to the die bonding or wire bonding process by an air cylinder actuated lower plate as the magazine is lowered stepwise by a stepping motor.

This automatic lead frame feeding device of the prior art is however disadvantageous in that the manual putting of the bent lead frames into the separate magazine is a tedious and time-consuming task and the replacement of the magazine is also a complicated task, resulting in lowering of productivity. Further, when the magazine is lowered stepwise by the stepping motor to feed the lead frames, index points may be out of register with each other, and thus jamming may occur.

SUMMARY OF THE INVENTION

In view of the aforesaid drawbacks of the prior art, it is an object of the present invention to provide an automatic lead frame feeding device for a TO-220 semiconductor manufacturing apparatus, which is able to load large quantities (approximately 90 sheets) of lead frames at a time without using a separate magazine for loading them, and then automatically and accurately feed them one by one.

To achieve the above object, there is provided according to one form of the present invention an automatic lead frame feeding device for a TO-220 semiconductor manufacturing apparatus, comprising a loading section including a pair of guide members disposed in spaced opposite relation to each other to stack up therebetween lead frames, a transferring section disposed at one side of the loading section for transverse movement to drop one by one the stacked lead frames in the loading section in sequence beginning with the lowermost lead frame, and a feeding section positioned to feed the dropped lead frame in the loading section to a subsequent process.

DESCRIPTION OF THE PREFERRED EMBODIMENT

The invention will now be described in more detail, by way of example, with reference to FIGS. 3 through 7 of the accompanying drawings.

Figure 1A:
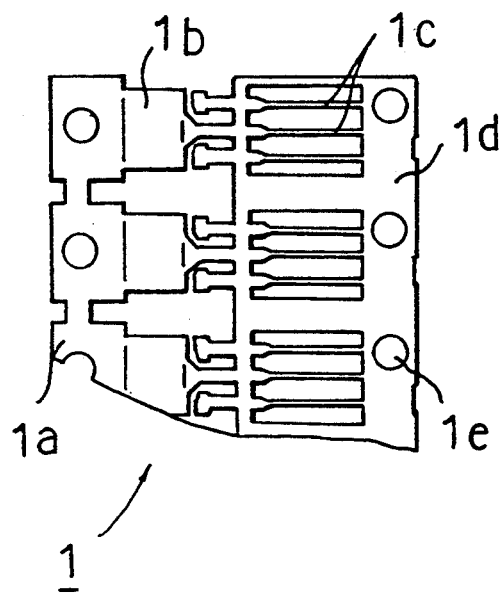
FIG. 1a and 1b are, respectively, a fragmentary plan view and a cross-sectional view of a lead frame for a common TO-220 semiconductor.
Figure 1B:
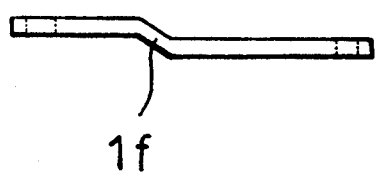
Figure 2:
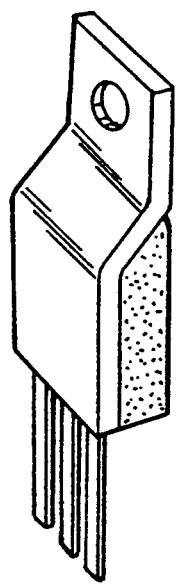
FIG. 2 is a perspective view of a completed assembly of the common TO-220 semiconductor.
Figure 3:
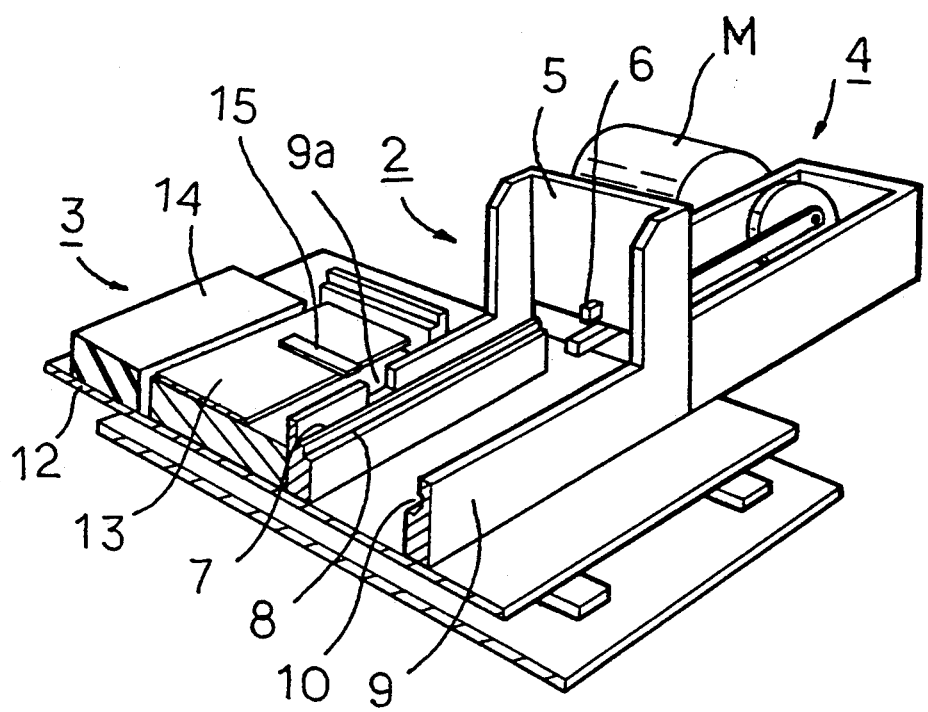
FIG. 3 is a perspective view, partly cut away, of an automatic lead frame feeding device for a TO-220 semiconductor manufacturing apparatus, according to the present invention.

Reference is first made to FIG. 3 which illustrates a perspective view, partly cut away, of an automatic lead frame feeding device for a TO-220 semiconductor manufacturing apparatus, according to an embodiment of the present invention. The lead frame feeding device comprises a loading section 2 for receiving therein lead frames 1 to be fed, a transferring section 3 disposed at one side of the loading section 2 for transverse movement to drop one by one the stacked lead frames 1 in the loading section in sequence beginning with the lowermost lead frame, and a feeding section 4 disposed at the rear of the loading section to extend longitudinally of the loading section, and serving to feed the dropped lead frame to the subsequent process.

Figure 4:
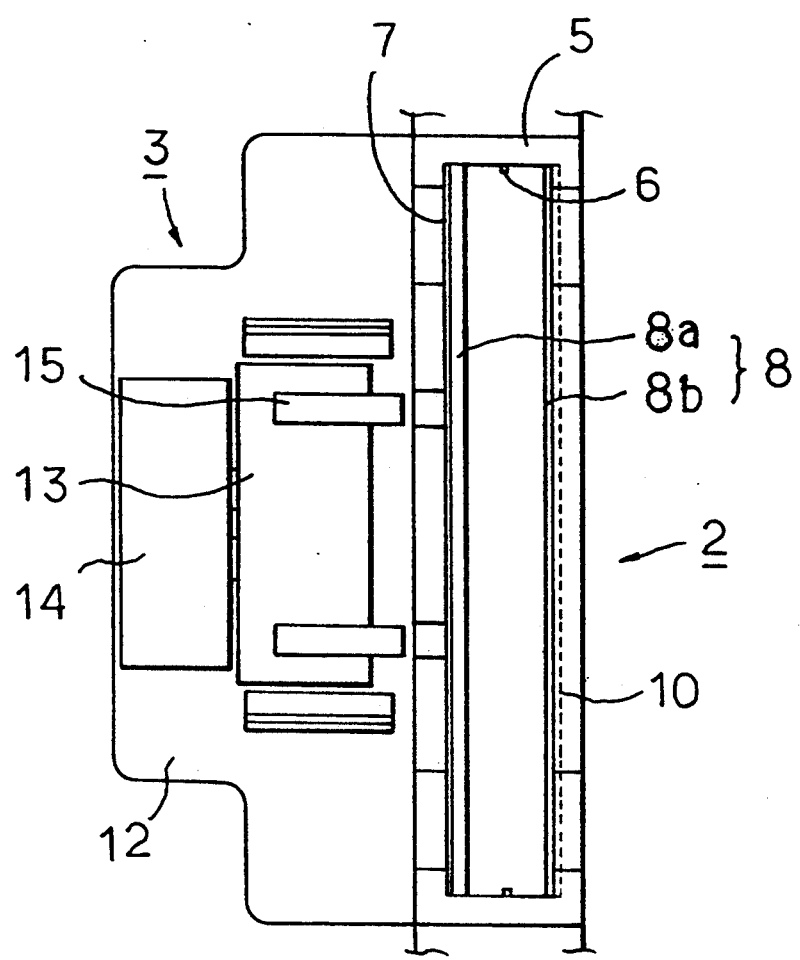
FIG. 4 is a plan view showing loading and transferring sections of the feeding device according to the present invention.
Figure 6:
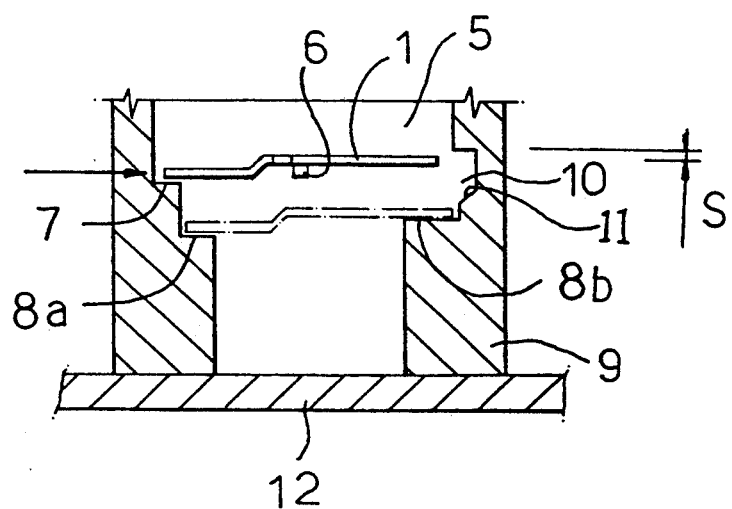
FIG. 6 is a transverse cross-sectional view of the loading section according to the present invention and FIG. 7a and 7b are fragmentary plan views showing operation of the device according to the present invention, FIG. 7a illustrating a state in which the lead frame is supported by a support rail before dropped, and FIG. 7b illustrating a state in which the lead frame is dropped and located on transfer rails.

Referring to FIG. 4 illustrating a plan view of the loading and transferring sections, and FIG. 6 illustrating a transverse cross-sectional view of the loading section, the loading section 2 includes a pair of guide members 5 disposed in spaced opposite relation to each other to stack up therebetween the lead frames 1 and each having a lug 6 formed at its lower end to support each of the opposite ends of the lead frame, and a pair of opposite side walls 9 extending between the guide members 5, one of the side walls being stepped at its inner side to define a longitudinally extending support rail 7 for supporting one side of the lead frame 1 and a transfer rail 8a longitudinally extending parallel to the support rail 7 at a level lower than the support rail. With this arrangement, the lead frames 1 stacked in the loading section 2 are supported by a pair of the lugs 6 provided on the opposite guide members 5 and the support rail 7 formed in one of the side walls.

In addition, as can be clearly seen in FIG. 6, the opposite side wall 9 is formed in its inner side with a retreating groove 10 and another transfer rail 8b arranged at levels approximately corresponding to the levels of the support rail 7 and the transfer rail 8a, respectively. The retreating groove 10 acts to temporarily receive the opposite side of the lead frame 1 being displaced in the direction of the arrow in FIG. 6, i.e., rightwards as viewed in the figure by pushers 15 of the transferring section 3, and thus prevent the lead frame from colliding against the side wall 9. At this time, a distance S between the upper surface of the lowermost lead frame and the upper wall surface of the retreating groove is determined to the less than the thickness of the lead frame. The reason for this is that when the lowermost lead frame is displaced in the direction of the arrow by the pushers 15 of the transferring section 3, the next lead frame just above the lowermost lead frame must be prevented from being transferred along with the lowermost frame.

In addition, as shown in FIG. 6, a sloping surface 11 is formed between the retreating groove 10 and the transfer rail 8b so that the lowermost lead frame being dropped by gravity may slide over the sloping surface 11 and then be safely put on the transfer rails 8a and 8b. At this time, to relieve a dropping shock of the lead frame 1 between the retreating groove 10 and the transfer rail 8b, the configuration of the sloping surface 11 may be changed or any suitable shock-absorbing material may be provided to the surface.

As shown in FIGS. 3 and 4, the transferring section 3 acting to transfer the lowermost lead frame 1 supported by the support rail 7 and the lugs 6 to the transfer rails 8 comprises a base plate 12 horizontally disposed at one side of the loading section 2, and a transfer plate 13 having a pair of the laterally spaced pushers 15 attached to its upper surface, and disposed on the upper surface of the base plate 12 to be able to be advanced and retracted by an air cylinder 14. With this arrangement, when transfer plate 13 having the pushers 15 is advanced toward the loading section 2 by means of the air cylinder 14, the pushers 15 advance through openings 9a formed in the side wall 9 having the support rail 7 to push an edge of a heat sink 1a of the lowermost lead frame 1 supported by the support rail 7 and the lug 6, thereby dropping the lead frame to the transfer rails 8.

Figure 5:
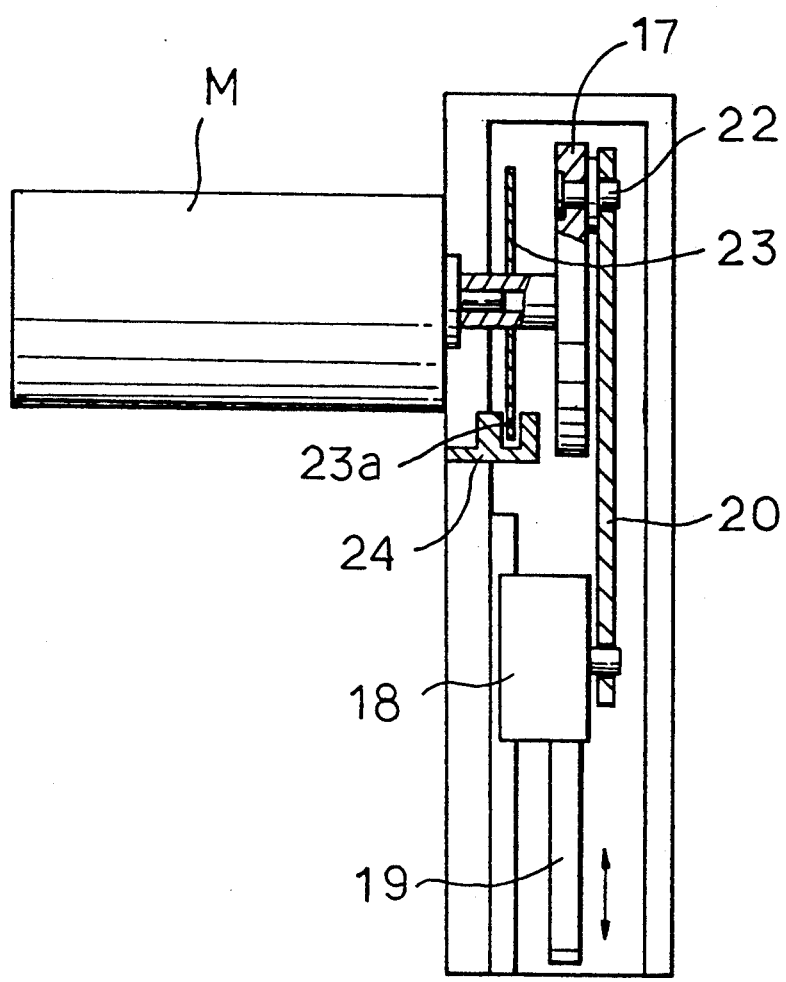
FIG. 5 is a plan view showing a feeding section of the device according to the present invention.

Referring now to FIG. 5 illustrating a plan view of the feeding section of the lead frame feeding device according to the present invention, the feeding section 4 is disposed at the rear of the loading section 2 and associated with the loading section to advance and feed the dropped lead frame 1 on the transfer rails 8 in the loading section to a subsequent process (for example, the die bonding or wire bonding process). Stated more specifically, the feeding section 4 comprises driving means such as a motor M installed externally thereof, a driving cam 17 disposed inwardly thereof to be rotated by the driving means, a pushing member 18 having a pusher rod 19 secured to its one end, and movable longitudinally of the feeding section, and a connecting rod 20 privotally coupled at one end to the driving cam 17 and at the other end to the pushing member 18 to convert rotational motion of the driving cam into linearly reciprocating motion of the pushing member. With this arrangement, as the driving cam 17 is rotated by driving of the motor, the pusher rod 19 of the pushing member 18 reciprocates to push the dropped lead frame 1 on the transfer rails 8 out of the loading section. Although in the illustrated embodiment the driving means comprises the motor M directly coupled to the driving cam 17, any other mechanical means such as a fluid cylinder may be employed as the driving means.

Since one end of the connecting rod 20 is coupled eccentrically to a marginal portion of the disc-shaped driving cam 17 by a connecting pin 22, as shown in FIG. 5, a stroke distance of the pusher rod 19 is two times the distance P between the centers of the driving cam 17 and connecting pin 22, and this corresponds to a linear displacement of the connecting pin upon completion of 180 degrees rotation of the driving cam. Therefore, this stroke distance may be adjusted by varying the diameter of the driving cam 17 and the set position of the connecting pin 22 depending upon the quantity of the lead frames to be transferred from the transfer rails 8 of the loading section 2.

Further, control means is provided to stop the driving cam 17 upon completion of the revolution thereof. As shown in FIG. 5, according to a preferred embodiment of the present invention, the control means comprises a disc 23 formed in its circumferential margin with a slit 23a and secured to a driving shaft of the motor for rotation therewith in the rear of the driving cam, and a sensor 24 disposed adjacent to the periphery of the disc 23 to detect the slit 23a of the disc. Therefore, when the slit 23a passes over the sensor 24 during rotation of the disc 23 concurrently with the driving cam 17, the sensor detects the slit, thereby issuing a signal for turning off a power source of the motor M. Furthermore, the motor M and the air cylinder 14 of the transferring section 3 are electrically interconnected through a controller (not shown) to be sequentially operated under control of the controller.

Operation of the device according to the present invention will now be explained with reference to FIGS. 7a and 7b.

Figure 7A:
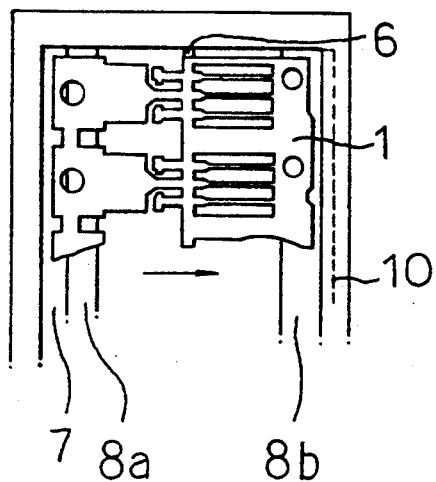
Figure 7B:
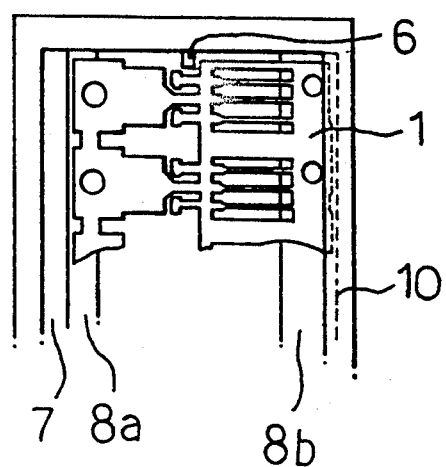

FIG. 7a shows a state in which the lead frame 1 is supported by the support rail 7 and the lugs 6 before being dropped, and FIG. 7b shows a state in which the lead frame is dropped and located on the transfer rails 8a and 8b. First, when a plurality (approximately 90 sheets) of the lead frames 1 are stacked up between a pair of the opposite guide members 5, they are retained in the loading section with the heat sink and opposite ends of the lowermost lead frame borne by the support rail and the lugs, respectively. In this state, when the air cylinder 14 is actuated, the transfer plate 13 having the pushers 15 is moved in the direction of the arrow in FIG. 7a, i.e., rightwards as viewed in the figure, so that the pushers 15 push the edge of the heat sink 1a of the lowermost lead frame 1 supported by the support rail 7 and a pair of the lugs 6. In this manner, if the pushers push the edge of the heat sink of the lowermost lead frame, the lead frame is displaced so that its opposite edge is temporarily received in the retreating groove 10 provided opposite to the support rail 7. As a result, the lead frame gets clear of the lugs 6 and the support rail 7, thereby being dropped downwardly by gravity. At this time, since the lead frame drops while sliding over the sloping surface 11 formed between the retreating groove 10 and the transfer rail 8b, and then is safely put on the transfer rails 8a and 8b, deformation of the lead frame due to a dropping shock may be prevented. After the lowermost lead frame has been dropped to the transfer rails 8a and 8b, as indicated by the dot-and-dash lines in FIG. 6, the air cylinder 14 of the transferring section 3 returns to the initial position and the next lead frame is lowered and supported by the lugs 6 and the support rail 7.

Then, the motor M of the feeding section 4 is driven by an electric signal issued from the controller in response to the returning of the air cylinder 14, thereby rotating the driving cam 17. As the driving cam 17 is rotated by the motor M, the pushing member 18 having the pusher rod 19 is advanced forward by the connecting rod 20 coupled to the driving cam in the direction of the arrow in FIG. 5, so that the pusher rod 19 pushes and feeds the dropped lead frame on the transfer rails to the subsequent process. At this time, if the sensor 24 disposed adjacent to the periphery of the disc 23 detects the slit 23a formed in the disc rotating concurrently with the driving cam 17, the power source of the motor M is turned off by the signal from the sensor, and thus the driving cam is stopped upon completion of one revolution.

The foregoing describes one cycle of operation of automatically feeding the lowermost one of the stacked lead frames in the loading section to the subsequent process. However, it will be understood that the foregoing described operation is performed repeatedly.

From the foregoing description, it will be appreciated that the present invention provides advantages over the prior art in that since the device can load large quantities of lead frames for TO-220 semiconductors at a time without using a separate magazine, and then automatically feed them sequentially one by one to the subsequent process, operation efficiency is enhanced and working hours are shortened, resulting in increasing productivity. Further, since the lead frame put on a pair of the transfer rails is horizontally moved and fed to the subsequent process by the feeding section, occurrence of jam due to misalignment of index points may be prevented.

While the invention has been shown and described with particular reference to a preferred embodiment thereof, it will be understood that variations and modifications may be made therein without departing from the spirit and scope of the invention as defined in the appended claims.

What is claimed is:

1. An automatic lead frame feeding device for a TO-220 semiconductor manufacturing apparatus in which the lead frame includes four sides, two of said sides being parallel and the remaining two of said sides forming a perimeter with the two parallel sides, the feeding device comprising:

a loading section including a pair of guide members vertically disposed in horizontally spaced opposite relation to each other to stack up lead frames therebetween, each guide member having a lower end;

a transferring section disposed at one side of said loading section for transverse movement to drop one by one the stacked lead frames in said loading section in sequence beginning with the lowermost lead frame;

a feeding section positioned to feed the dropped lead frame in said loading section to a subsequent process;

wherein said loading section further comprises a lug provided at each of the lower end of the guide members, each lug support supporting a respective one of said parallel sides of the lead frame;

a support rail extending parallel to a first one of said remaining sides of the lead frame between and transverse to said guide members to support said first remaining side;

two spaced transfer rails extending parallel to said support rail at a level lower than said support rail to receive the lead frame being dropped by said transferring section; and a retreating groove provided adjacent a second one of said remaining sides on the opposite side of said second remaining side from said first remaining side, said retreating groove being spaced horizontally from said support rail and positioned between said support rail and said transfer rail in a vertical direction; and wherein a lowermost one of a stack of lead frames is initially supported by the lugs on each of its parallel sides and by the support rail on the first of its remaining sides and subsequently translated in a horizontal direction toward the retreating groove by the feeding section such that the lead frame falls from the lugs and the support rail, the second remaining side of the lead frame is temporarily received by the retreating groove, and the lead frame subsequently falls onto the transfer rails.

2. The automatic lead frame feeding device as claimed in claim 1, in which a sloping surface of greater than 0° from said retreating groove toward said transfer rails is formed between said retreating groove and one of said transfer rails on a side opposite to said support rail to relieve a dropping shock of the lead frame.

3. The automatic lead frame feeding device as claimed in claim 1, in which said transferring section comprises:

a transfer plate movably disposed on a base plate and having a pair of laterally spaced pushers for pushing the lead frame in said loading section; and an air cylinder for advancing and retracting said transfer plate.

4. The automatic lead frame feeding device as claimed in claim 1, in which said feeding section comprises:

driving means for providing power;

a driving cam rotated by said driving means;

a pushing member;

a pusher rod secured to the pushing member to move the lead frame;

a connecting rod pivotally coupled at one end to said driving cam and at the other end to said pushing member to convert rotational motion of said driving cam into linearly reciprocating motion of said pushing member; and control means for stopping rotation of said driving cam.

5. The automatic lead frame feeding device as claimed in claim 4, in which said driving means comprises a motor.

6. The automatic lead frame feeding device as claimed in claim 4, in which said control means comprises:

a disc having a slit formed in its circumferential margin, and secured to a driving shaft of said driving means; and a sensor disposed adjacent to the periphery of said disc to detect said slit.

* * * * *